(12) United States Patent
Wang et al.

(10) Patent No.: US 11,282,913 B2
(45) Date of Patent: Mar. 22, 2022

(54) DISPLAY SUBSTRATE HAVING SIGNAL VIAS, METHOD FOR MANUFACTURING THE SAME, AND DISPLAY DEVICE HAVING THE SAME

(71) Applicant: BOE TECHNOLOGY GROUP CO., LTD., Beijing (CN)

(72) Inventors: Weihai Wang, Beijing (CN); Xiaochuan Chen, Beijing (CN); Shengji Yang, Beijing (CN); Pengcheng Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 127 days.

(21) Appl. No.: 16/624,217

(22) PCT Filed: May 7, 2019

(86) PCT No.: PCT/CN2019/085755
§ 371 (c)(1),
(2) Date: Dec. 18, 2019

(87) PCT Pub. No.: WO2019/214590
PCT Pub. Date: Nov. 14, 2019

(65) Prior Publication Data
US 2021/0074790 A1 Mar. 11, 2021

(30) Foreign Application Priority Data
May 9, 2018 (CN) .......................... 201810437587.0

(51) Int. Cl.
*H01L 29/08* (2006.01)
*H01L 27/32* (2006.01)
(Continued)

(52) U.S. Cl.
CPC ........ *H01L 27/3276* (2013.01); *H01L 27/326* (2013.01); *H01L 27/3246* (2013.01);
(Continued)

(58) Field of Classification Search
CPC ............. H01L 27/3276; H01L 27/3246; H01L 51/5206; H01L 51/5221; H01L 2251/5338
See application file for complete search history.

(56) References Cited

U.S. PATENT DOCUMENTS

| 7,948,168 | B2 | 5/2011 | Park et al. |
| 2004/0209389 | A1 | 10/2004 | Liang |
| 2010/0066240 | A1 | 3/2010 | Park et al. |

(Continued)

FOREIGN PATENT DOCUMENTS

| CN | 102629046 A | 8/2012 |
| CN | 102629046 B | 5/2015 |
| CN | 104752465 A | 7/2015 |

(Continued)

OTHER PUBLICATIONS

First Office Action issued to Chinese Application No. 201810437587.0 dated Mar. 18, 2021 with English translation, (17p).
(Continued)

*Primary Examiner* — Phuc T Dang
(74) *Attorney, Agent, or Firm* — Arch & Lake LLP

(57) ABSTRACT

A display substrate having a display region and at least one bonding region located on the periphery of the display region, includes: multiple first signal via holes located in the at least one bonding region and configured to provide bonding lead channels; and multiple second signal via holes located in the display region and configured to provide electrode lead channels. The diameter of each of the first signal via holes is greater than the diameter of any one second signal via hole.

17 Claims, 7 Drawing Sheets

(51) Int. Cl.
    *H01L 51/52*   (2006.01)
    *H01L 51/56*   (2006.01)
(52) U.S. Cl.
    CPC ...... *H01L 51/5206* (2013.01); *H01L 51/5221* (2013.01); *H01L 51/56* (2013.01); *H01L 2251/5338* (2013.01)

(56) References Cited

U.S. PATENT DOCUMENTS

| | | | | |
|---|---|---|---|---|
| 2012/0098799 | A1* | 4/2012 | Kim | G02F 1/133512 345/204 |
| 2012/0178234 | A1* | 7/2012 | Lee | H01L 28/20 438/382 |
| 2014/0191256 | A1* | 7/2014 | Park | H01L 29/78669 257/88 |
| 2014/0315339 | A1* | 10/2014 | Kim | H01L 51/5221 438/34 |
| 2016/0104803 | A1 | 4/2016 | Ahn et al. | |
| 2016/0260381 | A1* | 9/2016 | Gai | G09G 3/3266 |

FOREIGN PATENT DOCUMENTS

| | | |
|---|---|---|
| CN | 105097840 A | 11/2015 |
| CN | 104752465 B | 1/2018 |
| KR | 20160044168 A | 4/2016 |

OTHER PUBLICATIONS

International Search Report and Written Opinion dated Aug. 9, 2019, from application No. PCT/CN2019/085755.

* cited by examiner

DISPLAY SUBSTRATE HAVING SIGNAL VIAS, METHOD FOR MANUFACTURING THE SAME, AND DISPLAY DEVICE HAVING THE SAME

CROSS-REFERENCE TO RELATED APPLICATIONS

The present application is a national phase application under 35 U.S.C. § 371 of International Patent Application No. PCT/CN2019/085755, filed on May 7, 2019, which claims the priority to the Chinese Patent Application No. 201810437587.0, entitled "OLED display substrate, manufacturing method thereof, and display device", filed on May 9, 2018, the entire contents of both of which are hereby incorporated by reference.

TECHNICAL FIELD

The present disclosure relates to the field of display technologies, and in particular, to a display substrate, a method for manufacturing the same, and a display device.

BACKGROUND

At present, a micro display device based on technologies such as virtual reality (VR) or augmented reality (AR) needs to have high resolution, high brightness, and high contrast. Most of the micro display devices in the related art adopt organic light-emitting diode (OLED) display substrates having self-luminous performance for screen display.

SUMMARY

In one aspect, a display substrate is provided. The display substrate has a display area and at least one binding area located at a periphery of the display area. The display substrate includes: a plurality of first signal vias disposed in the at least one binding area and configured to provide a binding lead channel; and a plurality of second signal vias disposed in the display area and configured to provide an electrode lead channel. Each of the first signal vias has a larger aperture than any of the second signal vias.

In some arrangements, the display substrate further includes a substrate, and a display driving circuit, an insulating layer, and a pixel structure layer stacked on the substrate. The pixel structure layer includes a plurality of light emitting devices located in the display area, and the plurality of first signal vias and the plurality of second signal vias are disposed in the insulating layer. The display substrate further includes: a binding lead disposed in each of the first signal vias and configured to be bound to an input end of the display driving circuit; and an electrode lead disposed in each of the second signal vias and configured to connect an output end of the display driving circuit and a light emitting device. Each of the binding leads has a wire diameter larger than a wire diameter of any of the electrode leads.

In some arrangements, the insulating layer includes at least two insulating sub-layers disposed sequentially along a direction away from the substrate. The display substrate further includes a lead sub-layer disposed between every two adjacent insulating sub-layers. Each of the lead sub-layer includes a plurality of first connection leads disposed in the at least one binding area, and a plurality of second connection leads disposed in the display area, and the plurality of first connection leads and the plurality of second connection leads are insulated in pairs. Each of the first signal vias includes a first signal sub-hole disposed in each of the insulating sub-layer. Each of the binding leads includes a binding sub-lead disposed in each of the first signal sub-holes, and every two adjacent binding sub-leads are electrically coupled through the first connection lead in a corresponding lead sub-layer. Each of the second signal vias includes a second signal sub-hole disposed in each of the insulating sub-layers. Each of the electrode leads includes an electrode sub-lead disposed in each of the second signal sub-holes, and every two adjacent electrode sub-leads are electrically coupled through the second connection lead in a corresponding lead sub-layer.

In some arrangements, a binding sub-lead, in each of the binding leads, that is closest to the display driving circuit is coupled to an input end of the display driving circuit. An electrode sub-lead, in each of the electrode leads, that is closest to the display driving circuit is coupled to an output end of the display driving circuit, and an electrode sub-lead, in each of the electrode leads, that is closest to the pixel structure layer is coupled to one of the light emitting devices.

In some arrangements, orthographic projections of at least two of the first signal sub-holes in each of the first signal vias on the substrate at least partially coincide. Orthographic projections of at least two of the second signal sub-holes in each of the second signal vias on the substrate at least partially coincide.

In some arrangements, each of the first connection leads and each of the second connection leads in at least one of the lead sub-layers includes: a first waterproof lead portion, an intermediate conductive lead portion, and a second waterproof lead portion stacked sequentially along a direction away from the substrate.

In some arrangements, each of the first connection leads and each of the second connection leads in at least one of the lead sub-layers are opaque conductive leads.

In some arrangements, the pixel structure layer further includes a pixel defining layer disposed on a surface of the insulating layer facing away from the display driving circuit. The pixel defining layer has a plurality of pixel openings, and each of the pixel openings is provided with one of the light emitting devices.

In some arrangements, each of the light emitting devices includes an anode and a cathode disposed oppositely, and a light emitting functional layer located between the anode and the cathode. The anode is located on a side of the light emitting functional layer close to the insulating layer.

In some arrangements, the anode includes a titanium layer, a copper aluminum alloy layer, and a titanium nitride layer disposed in a stacked manner.

In some arrangements, the substrate is a single crystal silicon wafer, and a single crystal silicon material contained in the single crystal silicon wafer has a carrier mobility of 500 $cm^2/V \cdot s$~1500 $cm^2/V \cdot s$.

In another aspect, a method for manufacturing a display substrate is provided. The method for manufacturing the display substrate includes: forming a plurality of first signal vias configured to provide a binding lead channel in at least one binding area of the display substrate, and forming a plurality of second signal vias configured to provide an electrode lead channel in a display area of the display substrate. Each of the first signal vias has a larger aperture than any of the second signal vias. A binding lead is formed in each of the first signal vias and an electrode lead is formed in each of the second signal vias. Each of the binding leads has a wire diameter larger than a wire diameter of any of the electrode leads.

In some arrangements, forming a plurality of first signal vias configured to provide a binding lead channel in at least one binding area of the display substrate, and forming a plurality of second signal vias configured to provide an electrode lead channel in a display area of the display substrate, include: providing a substrate. A display driving circuit is formed on the substrate, the display driving circuit including a plurality of input ends located in the at least one binding area, and a plurality of output ends located in the display area. An insulating layer is formed on a surface of the display driving circuit facing away from the substrate. The plurality of first signal vias are formed in a portion of the insulating layer covering the plurality of input ends, and at least one of the first signal vias corresponds to one of the input ends. The plurality of second signal vias are formed in a portion of the insulating layer covering the plurality of output ends, and at least one of the second signal vias corresponds to one of the output ends.

In some arrangements, forming an insulating layer on a surface of the display driving circuit facing away from the substrate, further includes: forming at least two insulating sub-layers sequentially on the surface of the display driving circuit facing away from the substrate.

The method for manufacturing the display substrate further includes: forming, during a process for forming every two adjacent insulating sub-layers, a lead sub-layer on an insulating sub-layer formed firstly in the every two adjacent insulating sub-layers. The lead sub-layer includes a plurality of first connection leads disposed in the at least one binding area, and a plurality of second connection leads disposed in the display area, and the plurality of first connection leads and the plurality of second connection leads are insulated in pairs.

Forming a first signal via further includes: forming a first signal sub-hole in each of the insulating sub-layers, and forming the first signal via the first signal sub-holes in the at least two insulating sub-layers. Forming a binding lead in each of the first signal vias further includes: forming a binding sub-lead in each of the first signal sub-holes of the first signal via. Every two adjacent binding sub-leads are coupled by one of the first connection leads in a corresponding lead sub-layer.

Forming a second signal via further includes: forming a second signal sub-hole in each of the insulating sub-layers, and forming the second signal via by the second signal sub-holes in the at least two insulating sub-layers. Forming an electrode lead in each of the second signal vias further includes: forming an electrode sub-lead in each of the second signal sub-holes of the second signal via. Every two adjacent electrode sub-leads are coupled by one of the second connection leads in a corresponding lead sub-layer.

In some arrangements, the method for manufacturing the display substrate further includes: forming a pixel structure layer on a surface of the insulating layer facing away from the display driving circuit. The pixel structure layer includes a plurality of light emitting devices located in the display area, and one of the light emitting devices is coupled to at least one electrode lead.

In some arrangements, each of the light emitting devices includes an anode and a cathode disposed oppositely, and a light emitting functional layer located between the anode and the cathode. Forming a pixel structure layer on the surface of the insulating layer facing away from the display driving circuit includes: forming a plurality of anodes patterned on a surface of the insulating layer facing away from the display driving circuit by using a dry etching process, the plurality of anodes being located in the display area and each anode being coupled to at least one electrode lead. A pixel defining layer is formed on a surface of the insulating layer not covered by the plurality of anodes, and a surface of the plurality of anodes facing away from the insulating layer. A plurality of pixel openings are formed in the pixel defining layer, an orthographic projection of each pixel opening on the substrate being located within an orthographic projection of one anode on the substrate. The light emitting functional layer in contact with the anode is formed in each of the pixel openings. The cathode is formed on a surface of each of the light emitting functional layer facing away from the anode.

In still another aspect, a display device is provided. The display device includes the above display substrate.

BRIEF DESCRIPTION OF THE DRAWINGS

The drawings described herein are used to provide a further understanding of the present disclosure, which is a part of some arrangements of the present disclosure. The illustrative arrangements of the present disclosure and the description thereof are used to explain the present disclosure, and do not constitute an undue limitation of the present disclosure. In the drawing.

DETAILED DESCRIPTION

The technical solutions in some arrangements of the present disclosure will be described below in conjunction with the accompanying drawings in the arrangements of the present disclosure. It is obvious that the described arrangements are only a part of the arrangements of the present disclosure, and not all of the arrangements. All other arrangements obtained by those ordinary skilled in the art, based on some arrangements of the present disclosure, are within the scope of the present disclosure.

In the micro display device based on VR or AR technology, a display driving circuit in an OLED display substrate and an external circuit are bounded together by wire binding to effectively reduce the volume of the micro display device. However, during the process of performing line binding, the used metal traces configured to bind the display driving circuit and the external circuit are relatively thin, which tends to cause the metal trace to fall off. Thus, once the metal trace between the display driving circuit and the external circuit falls off, it is difficult for the micro display device to display normally.

Figure 1:
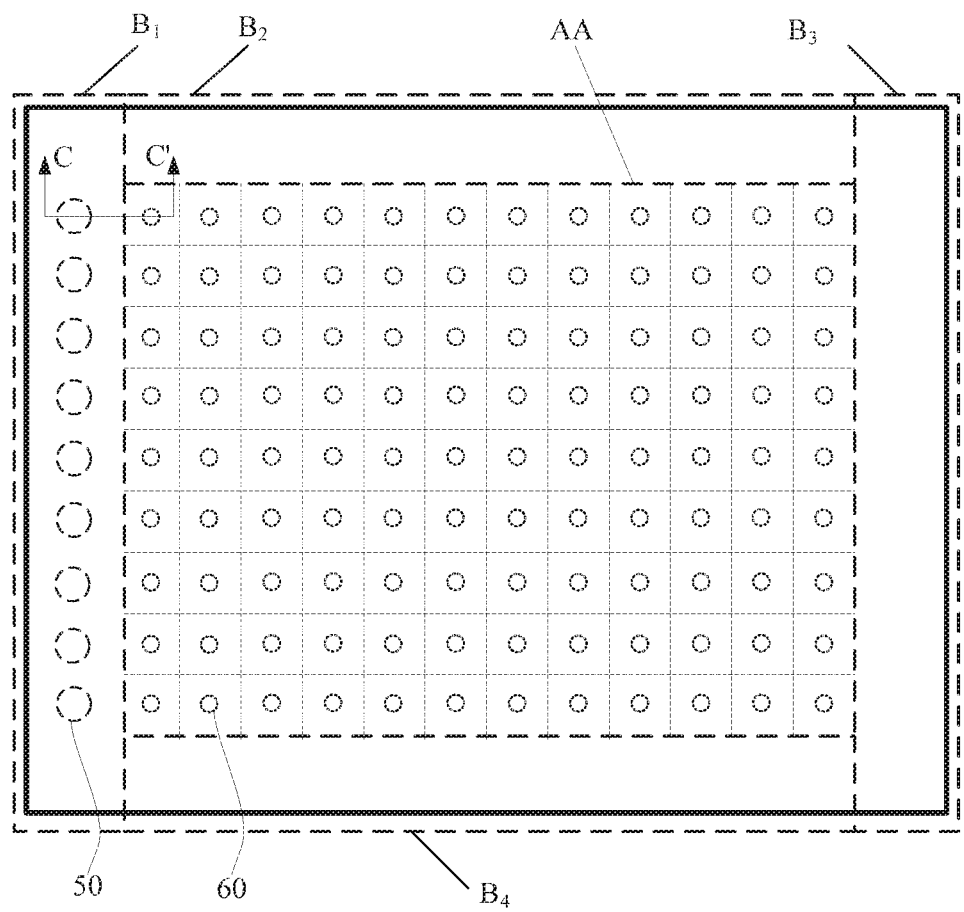
FIG. 1 is a schematic structural view of a display substrate according to some arrangements of the present disclosure.
Figure 2:
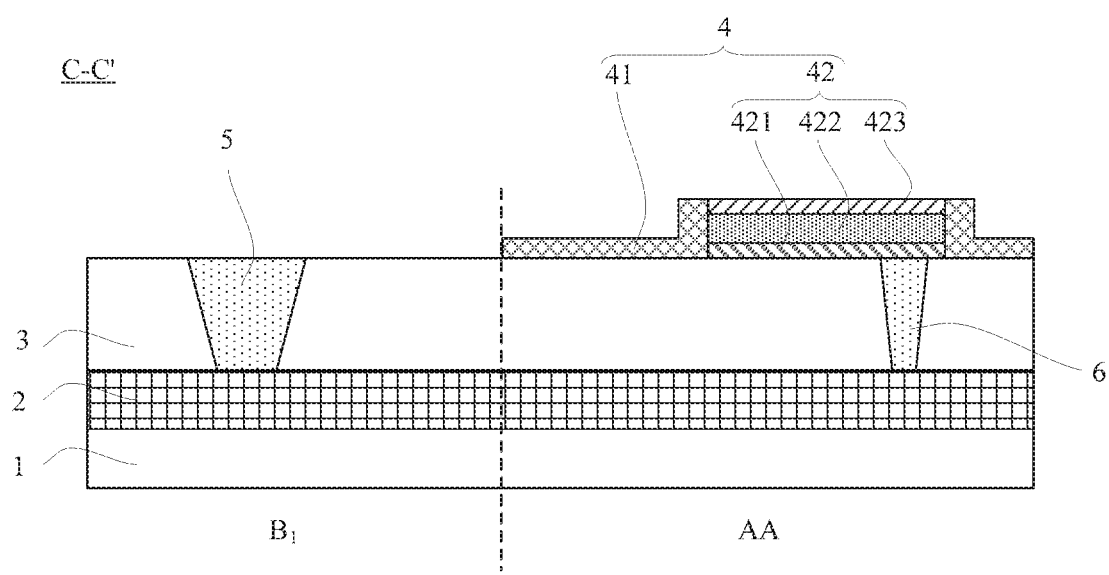
FIG. 2 is a cross-sectional view of the display substrate shown in FIG. 1 taken along line C-C'.

Referring to FIGS. 1 and 2, some arrangements of the present disclosure provide a display substrate. The display substrate has a display area AA and at least one binding area (for example, at least one of a B₁ area, a B₂ area, a B₃ area, or a B₄ area in FIG. 1) located at a periphery of the display area AA. The display substrate includes: a plurality of first signal vias 50 disposed in the at least one binding area and configured to provide a binding lead channel; and a plurality of second signal vias 60 disposed in the display area AA and configured to provide an electrode lead channel. Each of the first signal vias 50 has a larger aperture than any of the second signal vias 60.

Here, the apertures of the plurality of first signal vias 50 are the same or different, and the apertures of the plurality of second signal vias 60 are the same or different, which is not limited in some arrangements of the present disclosure. For example, the apertures of the plurality of first signal vias 50 are different, and the apertures of the plurality of second signal vias 60 are different, and the aperture of each of the first signal vias 50 being greater than that of any of the second signal vias 60 refers to that the smallest aperture of the plurality of first signal vias 50 is greater than the largest aperture of the plurality of second signal vias 60.

In addition, if the aperture of each of the first signal vias 50 changes gradually (e.g., each of the first signal vias 50 is a tapered via), and the aperture of each of the second signal vias 60 changes gradually (e.g., each of the second signal vias 60 is a tapered via), the aperture of each of the first signal vias 50 being greater than that of any of the second signal vias 60 refers to that the smallest aperture of the plurality of first signal vias 50 is greater than the smallest aperture of any of the second signal vias 60, or the smallest aperture of each of the first signal vias 50 is larger than the largest aperture of any of the second signal via 60.

In some arrangements, continuing to refer to FIG. 1 and FIG. 2, the display substrate further includes a substrate 1, and a display driving circuit 2, an insulating layer 3, and a pixel structure layer 4 stacked on the substrate. The pixel structure layer 4 includes a plurality of light emitting devices 42 in the display area AA, and the plurality of first signal vias 50 and the plurality of second signal vias 60 are disposed in the insulating layer 3. For example, the display substrate is an OLED display substrate, and each of the light-emitting devices 42 in the pixel structure layer 4 is an OLED. In an arrangement, if the display substrate is a quantum dot light emitting diodes (QLED) display substrate, each of the light-emitting devices 42 in the pixel structure layer 4 is a QLED. Some arrangements of the present disclosure do not limit the type of light emitting device.

Here, the display driving circuit 2 generally includes a plurality of pixel circuits and a plurality of signal lines correspondingly coupled to the plurality of pixel circuits. An input end of one of the signal lines corresponds to an input end of the display driving circuit 2, and the output end of each of the pixel circuit is coupled to the light emitting device 42. The output end of each pixel circuit corresponds to an output end of the display driving circuit 2. The number of first signal vias 50 should be determined according to types of signals that the display driving circuit 2 needs to transmit, and the number of second signal vias 60 should be determined according to the number of light-emitting devices 42 in the display substrate.

The display substrate further includes: a binding lead 5 disposed in each of the first signal vias 50 and configured to be bound to an input end of the display driving circuit 2; and an electrode lead 6 disposed in each of the second signal vias 60 and configured to connect an output end of the display driving circuit 2 and the light emitting device 42. Each of the binding leads 5 has a wire diameter larger than a wire diameter of any of the electrode leads 6. Here, the wire diameter of the binding lead 5 means a diameter perpendicular to the linear extension direction thereof, and the wire diameter of the electrode lead 6 means a diameter perpendicular to the linear extension direction thereof.

By way of example, each of the binding leads 5 is formed by filling a conductive material in the corresponding first signal via 50, each of the electrode leads 6 is formed by filling a conductive material in the corresponding second signal via 60. Thus, the shape of each of the binding leads 5 matches the shape of the corresponding first signal via 50, and the shape of the binding leads matches the shape of the corresponding second signal via 60. For some arrangements of the present disclosure, the definition of "each of the binding leads 50 has a wire diameter larger than a wire diameter of any of the electrode leads 60" may refer to the relevant definition of "each of the first signal vias 50 has a larger aperture than any of the second signal vias 60" described above, which is not described herein again.

In some arrangements of the present disclosure, the plurality of first signal vias are formed in at least one binding area of the display substrate during the process of manufacturing the display substrate, and the plurality of first signal vias 50 may be used to form a plurality of binding leads 5, that is, the plurality of binding leads 5 are fixed to the binding area of the display substrate to perform line binding on the respective input ends of the display driving circuit 2.

Moreover, some arrangements of the present disclosure set the aperture of each of the first signal vias 50 to be larger than the aperture of any of the second signal vias 60, so that the wire diameter of each of the binding leads 5 is larger than that of any of the electrode leads 6. That is, the wire diameter of each of the binding leads 5 can be effectively increased compared with the conventional electrode lead, thus effectively improving the connection strength and the wear resistance of each of the binding wires 5, and further preventing the binding leads between the display driving circuit 2 and the external circuit in the display substrate from falling off.

As such, when the display substrate provided by some arrangements of the present disclosure is applied to the micro display device, particularly a micro mobile display device, the use reliability of the micro display device can be improved, and it is ensured that the micro display device can be normally displayed.

Figure 3:
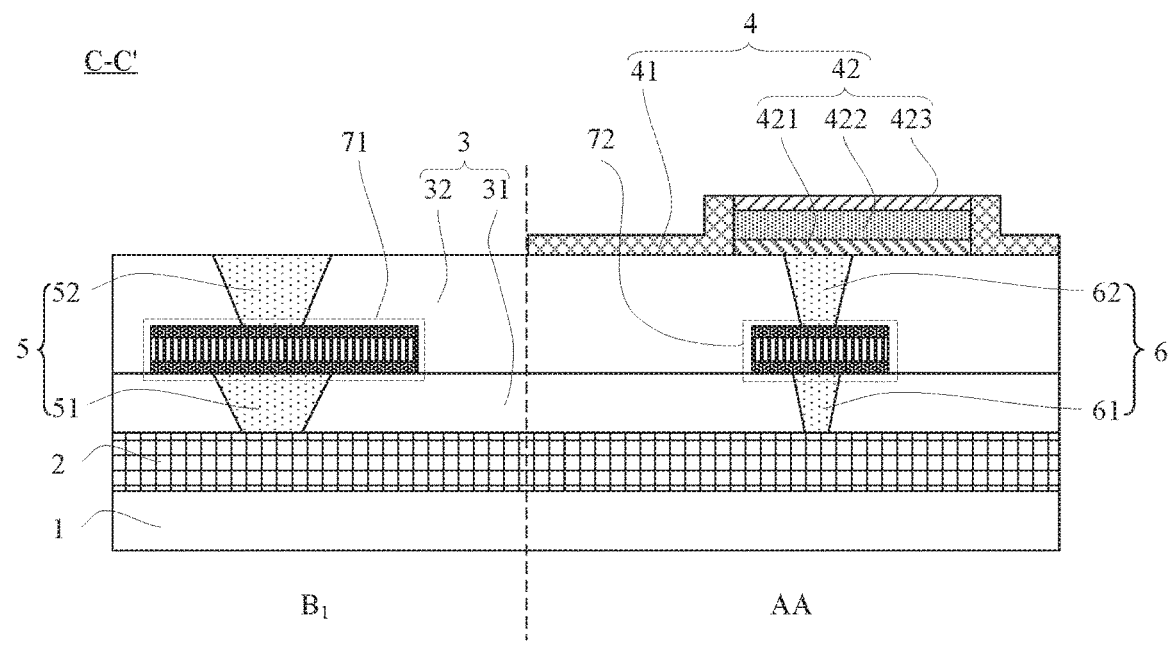
FIG. 3 is a cross-sectional view of another display substrate shown in FIG. 1 taken along line C-C'.
Figure 6:
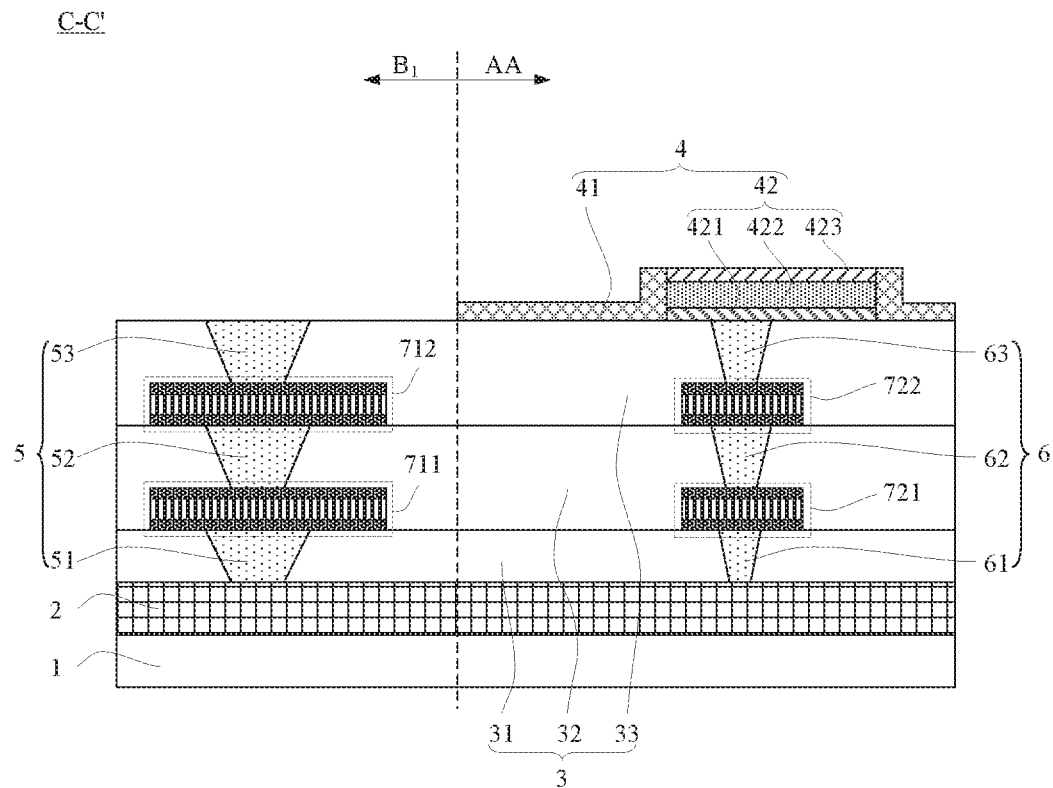
FIG. 6 is a cross-sectional view of another display substrate shown in FIG. 1 taken along line C-C'.

Referring to FIG. 3 and FIG. 6, in some arrangements, the insulating layer 3 includes at least two insulating sub-layers (for example, the first insulating sub-layer 31 and the second insulating sub-layer 32 shown in FIG. 3, or the first insulating sub-layer 31, the second insulating sub-layer 32 and the third insulating sub-layer 33 shown in FIG. 6) disposed sequentially in a direction away from the substrate 1. The display substrate further includes lead sub-layers disposed between every two adjacent insulating sub-layers. Each of the lead sub-layers includes a plurality of first connection leads 71 disposed in the at least one binding area, and a plurality of second connection leads 72 disposed in the display area AA, and the plurality of first connection leads 71 and the plurality of second connection leads 72 are insulated in pairs. Here, the plurality of first connection leads 71 are in one-to-one correspondence with the plurality of first signal vias 50, and the plurality of second connection leads 72 are in one-to-one correspondence with the plurality of second signal vias 60.

Continuing to refer to FIG. 3 and FIG. 6, in the above display substrate, each of the first signal vias 50 includes a first signal sub-hole disposed in each of the insulating sub-layer; each of the binding leads 5 includes a binding sub-lead (for example, the first binding sub-lead 51 and the second binding sub-lead 52 shown in FIG. 3, or the first binding sub-lead 51, the second binding sub-lead 52 and the third binding sub-lead 53 as shown in FIG. 6) disposed in each of the first signal sub-holes, and every two adjacent binding sub-leads are electrically coupled through the first connection lead 71 in a corresponding lead sub-layer. Thus, in the same spatial range corresponding to each binding lead 5, the length and conductivity of the binding lead 5 can be equivalently increased by using the first connection lead 71 between every two adjacent binding sub-leads. That is, the length and the electrical conductivity of the first connection lead 71 can be regarded as equivalent to the length and conductivity of the binding lead 5. Thus, in the case of ensuring that each binding lead 5 has the same conductivity, if the length of the binding lead 5 is increased, the wire diameter of the binding lead 5 can be correspondingly reduced, thus reducing the orthographic area of the binding area on the substrate 1 to achieve miniaturization of the binding area in the display substrate.

Each of the second signal vias 60 includes a second signal sub-hole disposed in each of the insulating sub-layers; each of the electrode leads 6 includes an electrode sub-lead (for example, the first electrode sub-lead 61 and the second electrode sub-lead 62 shown in FIG. 3, or the first electrode sub-lead 61, the second electrode sub-lead 62 and the third electrode sub-lead 63 as shown in FIG. 6) disposed in each of the second signal sub-holes, and every two adjacent electrode sub-leads are electrically coupled through the second connection lead 72 in a corresponding lead sub-layer. Thus, in the same spatial range corresponding to each electrode lead 6, the length and conductivity of the electrode lead 6 can be equivalently increased by using the second connection lead 72 between every two adjacent electrode sub-leads. That is, the length and the electrical conductivity of the second connection lead 72 can be regarded as equivalent to the length and conductivity of the electrode lead 6.

In the case where each of the binding leads 5 is composed of a plurality of binding sub-leads, the binding sub-lead in each binding lead 5 that is closest to the display driving circuit 2 is coupled to an input end of the display driving circuit 2. In the case where each of the electrode leads 6 is composed of a plurality of electrode sub-leads, the electrode sub-lead in each of the electrode leads 6 that is closest to the display driving circuit 2 is coupled to an output end of the display driving circuit 2, and the electrode sub-lead in each of the electrode leads 6 that is closest to the pixel structure layer 4 is coupled to the light emitting device 42.

In some arrangements of the present disclosure, the insulating layer 3 is composed of at least two insulating sub-layers, such that the thickness of the insulating layer 3 can be effectively increased by increasing the number of layers of the insulating sub-layer to correspondingly increase the hole depth of each of the first signal vias 50 formed in the insulating layer 3, thus protecting the binding lead 5 in a respective first signal via 50, and preventing the binding wires 5 from being broken or falling off under the action of external force or long-term wear.

In some examples, referring to FIG. 3, the insulating layer 3 includes two insulating sub-layers, which are a first insulating sub-layer 31 and a second insulating sub-layer 32, respectively. The display substrate further includes a lead sub-layer between the first insulating sub-layer 31 and the second insulating sub-layer 32. The first insulating sub-layer 31 is located between the display driving circuit 2 and the lead sub-layer, and the second insulating sub-layer 32 is located between the lead sub-layer and the pixel structure layer 4. The lead sub-layer includes a plurality of first connection leads 71 located in the binding area B1, and a plurality of second connection leads 72 located in the display area AA, and the plurality of first connection leads 71 and the plurality of The second connection leads 72 are insulated in pairs.

Here, the plurality of first connection leads 71 and the plurality of second connection leads 72 are obtained by patterning a same conductive film. Every two adjacent connection leads may be insulated from each other by the second insulating sub-layer 32.

Each of the first signal vias 50 includes two first signal sub-holes, one of which is disposed in the first insulating sub-layer 31 and the other is disposed in the second insulating sub-layer 32. Each of the binding leads 5 includes a first binding sub-lead 51 located in a first signal sub-hole of the first insulating sub-layer 31 and a second binding sub-lead 52 located in a first signal sub-hole of the second insulating sub-layer 32. The first binding sub-lead 51 and the second binding sub-lead 52 in each binding lead 5 are coupled by a first connection lead 71. One end of each first binding sub-lead 51 away from the second binding sub-lead 52 is coupled to an input end of the display driving circuit 2, and one end of each second binding sub-lead 52 away from the first binding sub-lead 51 is coupled to an external circuit. The signals transmitted by the external circuit to each of the binding leads 5 may be transmitted to the corresponding input ends of the display driving circuit 2 through the second binding sub-lead 52, the first connection lead 71, and the first binding sub-lead 51 sequentially.

Similarly, each of the second signal vias 60 includes two first signal sub-holes, one of which is disposed in the first insulating sub-layer 31 and the other is disposed in the second insulating sub-layer 32. Each of the electrode leads 6 includes a first electrode sub-lead 61 located in a second signal sub-hole of the first insulating sub-layer 31 and a second electrode sub-lead 62 located in a second signal sub-hole of the second insulating sub-layer 32. The first electrode sub-lead 61 and the second electrode sub-lead 62 in each electrode lead 6 are coupled by a second connection lead 72. One end of each first electrode sub-lead 61 away from the second electrode sub-lead 62 is coupled to an output end of the display driving circuit 2, and one end of each second electrode sub-lead 62 away from the first electrode sub-lead 61 is coupled to the light-emitting device 42. The signals outputted from each of the output ends of the display driving circuit 2 may be transmitted to the light-emitting device 42 through the first electrode sub-lead 61, the second connection lead 72, and the second electrode sub-lead 62 sequentially, thus driving the light-emitting device 42 to emit light.

In other examples, referring to FIG. 6, the insulating layer 3 includes three insulating sub-layers, which are a first insulating sub-layer 31, a second insulating sub-layer 32, and a third insulating sub-layer 33, respectively. The display substrate further includes a first lead sub-layer between the first insulating sub-layer 31 and the second insulating sub-layer 32, and a second lead sub-layer between the second insulating sub-layer 32 and the third insulating sub-layer 33. The first insulating sub-layer 31 is located between the display driving circuit 2 and the first lead sub-layer, the second insulating sub-layer 32 is located between the first lead sub-layer and the second lead sub-layer, and the third insulating sub-layer 33 is located between the second lead sub-layer and the pixel structure layer 4.

The first lead sub-layer includes a plurality of first connection leads 71 disposed in the binding area $B_1$, and a plurality of second connection leads 72 disposed in the display area AA, and the plurality of first connection leads 71 and the plurality of second connection leads 72 are insulated in pairs. Here, the plurality of first connection leads 711 and the plurality of second connection leads 721 in the first lead sub-layer are obtained by patterning the same conductive film. Every two adjacent connection leads are insulated from each other by the second insulating sub-layer 32.

The second lead sub-layer includes a plurality of first connection leads 712 located in the binding area B1, and a plurality of second connection leads 722 located in the display area AA, and the plurality of first connection leads 712 and the plurality of second connection leads 722 in the second lead sub-layer are insulated in pairs. Here, the plurality of first connection leads 711 and the plurality of second connection leads 721 in the second lead sub-layer are obtained by patterning the same conductive film. Every two adjacent connection leads are insulated from each other by the third insulating sub-layer 32.

Each of the first signal vias 50 includes three first signal sub-holes, one of which is disposed in the first insulating sub-layer 31, one is disposed in the second insulating sub-layer 32, and the other is disposed in the third insulating sub-layer 33. Each of the binding leads 5 includes a first binding sub-lead 51 located in a first signal sub-hole of the first insulating sub-layer 31, a second binding sub-lead 52 located in a first signal sub-hole of the second insulating sub-layer 32 and a third binding sub-lead 53 located in a first signal sub-hole of the third insulating sub-layer 33. In each of the binding leads 5, the first binding sub-lead 51 and the second binding sub-lead 52 are coupled by one of the first connection lead 711, the second binding sub-lead 52 and the third binding sub-lead 53 are coupled by one of the first connection lead 712 in the second lead sub-layer. Moreover, one end of each of the first binding sub-leads 51 away from the second binding sub-lead 52 is coupled to an input end of the display driving circuit 2, and one end of each of the third binding sub-leads 53 away from the second binding sub-lead 52 is coupled to an external circuit. The signal transmitted by the external circuit to each of the binding leads 5 may be transmitted to the corresponding input end of the display driving circuit 2 through the third binding sub-lead 53, the first connection lead 712 in the second lead sub-layer, the second binding sub-lead 52, and the first connection lead 711 and the first binding sub-lead 51 sequentially.

Similarly, each of the second signal vias 60 includes three second signal sub-holes, one of which is disposed in the first insulating sub-layer 31, one is disposed in the second insulating sub-layer 32, and the other is disposed in the third insulating sub-layer 33. Each of the electrode leads 6 includes a first electrode sub-lead 61 located in a second signal sub-hole of the first insulating sub-layer 31, a second electrode sub-lead 62 located in a second signal sub-hole of the second insulating sub-layer 32 and a third electrode sub-lead 63 located in a second signal sub-hole of the third insulating sub-layer 33. In each of the electrode leads 6, the first electrode sub-lead 61 and the second electrode sub-lead 62 are coupled by one of the second connection lead 721 in the first lead sub-layer, the second electrode sub-lead 62 and the third electrode sub-lead 63 are coupled by one of the second connection lead 722 in the second lead sub-layer. Moreover, one end of each of the first electrode sub-lead 61 away from the second electrode sub-lead 62 is coupled to an output end of the display driving circuit 2, and one end of each of the third electrode sub-leads 63 away from the second electrode sub-lead 62 is coupled to the light-emitting device 42. The signals outputted from each of the output ends of the display driving circuit 2 may be transmitted to the corresponding light-emitting device 42 through the first electrode sub-lead 61, the second connection lead 721 in the first lead sub-layer, a second electrode sub-lead 62, a second connection lead 722 in the second lead sub-layer, and a third electrode sub-lead 63 sequentially, thus driving the light-emitting device 42 to emit light.

Continuing to refer to FIGS. 3 and 6, in some arrangements, orthographic projections of at least two of the first signal sub-holes in each of the first signal vias 50 on the substrate 1 at least partially coincide. That is to say, in respective first signal sub-holes of each first signal via 50, the orthographic projections of at least two first signal sub-holes on the substrate 1 coincide or approximately coincide, or a portion of an orthographic projection of at least one first signal sub-hole on the substrate 1 is located within an orthographic projection of any of the other first signal sub-holes in the same first signal via 50 on the substrate 1.

For example, in respective first signal sub-holes of each first signal via 50, a portion of an orthographic projections of at least one first signal sub-hole on the substrate 1 is located within an orthographic projection of its adjacent first signal sub-hole on the substrate 1, which is convenient to realize the electrical connection of the binding sub-leads in the adjacent two first signal sub-holes.

Similarly, orthographic projections of at least two of the second signal sub-holes in each of the second signal vias 60 on the substrate 1 at least partially coincide. That is to say, in respective second signal sub-holes of each second signal via 60, the orthographic projections of at least two second signal sub-holes on the substrate 1 coincide or approximately coincide, or a portion of an orthographic projection of at least one second signal sub-hole on the substrate 1 is located within an orthographic projection of any of the other first signal sub-holes in the same second signal via 60 on the substrate 1.

For example, in respective second signal sub-holes of each second signal via 60, a portion of an orthographic projection of at least one second signal sub-hole on the substrate 1 is located within an orthographic projection of its adjacent second signal sub-hole on the substrate 1, which is convenient to realize the electrical connection of the binding sub-leads in the adjacent two second signal sub-holes.

In some arrangements, the orthographic projections of respective first signal sub-holes in each of the first signal vias 50 on the substrate 1 coincide, and the orthographic projections of respective second signal sub-holes in each of the second signal vias 60 on the substrate 1 coincide. Thus, in the case where the insulating layer 3 is composed of a plurality of insulating sub-layers, each of the first signal sub-holes and each of the second signal sub-holes can be formed in each insulating sub-layer using the same mask, which is advantageous for simplifying the fabrication process of the display substrate.

Further, each of the insulating sub-layers included in the insulating layer 3 is formed using the same insulating light-transmitting material, such as an insulating material such as silicon oxide, silicon nitride or aluminum oxide ceramic.

Figure 4:
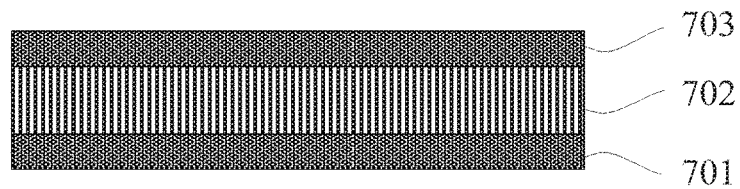
FIG. 4 is a schematic structural view of a first connection lead in the display substrate shown in FIG. 3.

Referring to FIGS. 3 and 4, in some arrangements, each of the first connection leads 71 and each of the second connection leads 72 in at least one of the lead sub-layers includes: a first waterproof lead portion 701, an intermediate conductive lead portion 702, and a second waterproof lead portion 703 stacked sequentially in a direction away from the substrate 1. Thus, by using the first waterproof lead portion 701, the intermediate conductive lead portion 702 and the second waterproof lead portion 703 in each of the connection leads, a water vapor isolation space can be constructed for the intermediate conductive lead portion 702, thus preventing the intermediate conductive lead portion 702 from being corroded by water vapor, and it is ensured that each of the first connection leads 71 and each of the second connection leads 72 has a longer service life. Here, the first waterproof lead portion 701 and the second waterproof lead portion 703 are provided with electrical conductivity as components of the corresponding connection lead.

Moreover, in some arrangements, each of the first connection leads 71 and each of the second connection leads 72 in at least one of the lead sub-layers are opaque conductive leads, such as made of a metallic conductive material. Thus, when the light emitted by each of the light-emitting devices 42 is irradiated to any of the first connection leads 71 or any of the second connection leads 72, the light is reflected by the first connection leads 71 or the second connection leads 72, thus improving the light use efficiency of each of the light emitting devices 42 in the display substrate and increasing the brightness of the screen displayed on the display substrate.

Exemplarily, the first waterproof lead portion 701 and the second waterproof lead portion 703 are formed using a titanium nitride (TiN) material, and the intermediate conductive lead portion 702 is formed using a copper-aluminum alloy material.

Referring to FIG. 2, in some arrangements, the pixel structure layer 4 further includes a pixel defining layer 41 disposed on a surface of the insulating layer 3 facing away from the display driving circuit 2. The pixel defining layer 41 is generally located in the display area AA, and has a plurality of pixel openings, and each of the pixel openings is provided with the light emitting device 42. Each of the light emitting devices 42 includes an anode 421 and a cathode 423 disposed oppositely, and a light emitting functional layer 422 between the anode 421 and the cathode 422. The anode 421 is located on a side of the light emitting functional layer 422 close to the insulating layer 3. Each electrode lead 6 is coupled to the light emitting device 42, indicated by that each electrode lead 6 is coupled to the anode 421 of the light emitting device 42.

Figure 5:
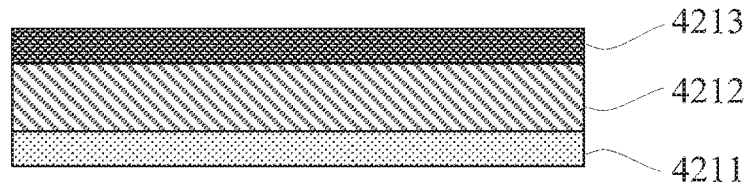
FIG. 5 is a schematic structural view of an anode in the display substrate shown in FIG. 3.

Here, the anode 421 of each of the light-emitting devices 42 is formed by dry etching, which is advantageous for forming the anode 421 having a smaller size, thus forming the light-emitting device 42 having a smaller size. That is, miniaturization of the light-emitting device 42 is achieved, thus improving the resolution of the display substrate. When the display substrate is applied to a micro display device, the high resolution of the display substrate can reduce the graininess of the displayed image of the micro display device Further, in some examples, the anode 421 of each of the light emitting devices 42 includes at least one of a titanium (Ti) layer, a copper aluminum alloy (AlCu) layer, or a titanium nitride (TiN) layer. For example, as shown in FIG. 5, the anode 421 of each of the light emitting devices 42 includes a titanium (Ti) layer 4211, a copper aluminum alloy (AlCu) layer 4212, and a titanium nitride (TiN) layer 4213 disposed in a stacked manner. Here, the titanium (Ti) layer 4211 in each anode 421 is coupled to the corresponding electrode lead 6, or the titanium nitride (TiN) layer 4213 in each anode 421 is coupled to the corresponding electrode lead 6.

It is to be noted that, in some arrangements, the substrate 1 of the display substrate is a single crystal silicon wafer (that is, a single crystal silicon substrate), and a single crystal silicon material contained in the single crystal silicon wafer has a carrier mobility of 500 $cm^2/V \cdot s$~1500 $cm^2/V \cdot s$, so that the display driving circuit 2 formed on the surface of the substrate 1 has a relatively faster signal transmission speed. Thus, when the display substrate is applied to a micro display device, the screen refresh frequency of the micro display device can be effectively improved, thus ensuring that the displayed image of the micro display device provides a better visual experience for the user.

Some arrangements of the present disclosure provide a method for manufacturing a display substrate. Referring to FIG. 1 to FIG. 6, the method for manufacturing the display substrate includes S100 to S200. In S100, a plurality of first signal vias 50 configured to provide a binding lead channel in at least one binding area (e.g., area $B_1$ in FIG. 1) of the display substrate are formed, and a plurality of second signal vias 60 configured to provide an electrode lead channel in a display area AA of the display substrate are formed. Each of the first signal vias 50 has a larger aperture than any of the second signal vias 60.

In some examples, S100 includes S110~S140.

In S110, a substrate 1 is provided.

The material of the substrate 1 can be selected according to actual needs, which is not limited in some arrangements of the present disclosure. For example, the substrate 1 is formed using a single crystal silicon material having a carrier mobility of 500 $cm^2/V \cdot s$ to 1500 $cm^2/V \cdot s$.

In S120, a display driving circuit 2 is formed on the substrate 1, and the display driving circuit 2 includes a plurality of input ends located in at least one binding area (for example, area $B_1$ in FIG. 1), and a plurality of output ends located in the display area AA.

The display driving circuit 2 generally includes a plurality of pixel circuits and a plurality of signal lines coupled to each of the pixel circuits. An input end of one of the signal lines corresponds to an input end of the display driving circuit 2, and an output end of each of the pixel circuits is coupled to the light emitting device 42. An output end of each pixel circuit corresponds to an output end of the display driving circuit 2.

In S130, an insulating layer 3 is formed on the surface of the display driving circuit 2 facing away from the substrate 1.

In S140, the plurality of first signal vias 50 are formed in a portion of the insulating layer 3 covering the plurality of input ends, and the at least one first signal via 50 corresponds to one input end. The plurality of second signal vias 60 are formed in a portion of the insulating layer 3 covering the plurality of output ends, and the at least one second signal via 60 corresponds to one output end.

In S200, a binding lead 5 is formed in each of the first signal vias 50, and an electrode lead 6 is formed in each of the second signal vias 60. Each of the binding leads has a wire diameter larger than a wire diameter of any of the electrode leads. Here, the wire diameter of the binding lead 5 means a diameter perpendicular to the linear extension direction thereof, and the wire diameter of the electrode lead 6 means a diameter perpendicular to the linear extension direction thereof.

The method for manufacturing the display substrate provided by some arrangements of the present disclosure is the same as that of the display substrate provided by some of the above arrangements, and details are not described herein.

Moreover, in some arrangements, the method for manufacturing the display substrate further includes S300.

In S300, a pixel structure layer 4 is formed on a surface of the insulating layer 3 facing away from the display driving circuit 2, the pixel structure layer 4 includes a plurality of light emitting devices 42 located in the display area AA, and one light emitting device 42 is coupled to at least one electrode lead 6.

In some examples, each of the light emitting devices 42 includes an anode 421 and a cathode 423 disposed oppositely, and a light emitting functional layer 422 located between the anode 421 and the cathode 423. The above S300 includes S310 to S340.

In S310, a plurality of anodes 421 patterned on a surface of the insulating layer 3 facing away from the display driving circuit 2 is formed by using a dry etching process. The plurality of anodes 421 are located in the display area AA, and each anode 421 is coupled to at least one electrode lead 6.

In S320, a pixel defining layer 41 having a plurality of pixel openings is formed on a surface of the insulating layer 3 not covered by the plurality of anodes 421. An orthographic projection of each pixel opening on the substrate 1 being located within an orthographic projection of one anode 421 on the substrate 1.

Here, the pixel defining layer 41 is generally formed on a surface of the insulating layer 3 located within the display area AA.

In S330, the light emitting functional layer 422 in contact with the anode 421 is formed in each of the pixel openings of the pixel defining layer 41.

In S340, the cathode 423 is formed on a surface of each of the light emitting functional layer 422 facing away from the anode 421.

Referring to FIG. 3 and FIG. 6, in some arrangements, S130 further includes: forming at least two insulating sub-layers sequentially on a surface of the display driving circuit 2 facing away from the substrate 1.

Based on this, the method for manufacturing the display substrate further includes: forming, during a process for forming every two adjacent insulating sub-layers, a lead sub-layer on the insulating sub-layer formed firstly in the every two adjacent insulating sub-layers. The lead sub-layer includes a plurality of first connection leads 71 disposed in the at least one binding area, and a plurality of second connection leads 72 disposed in the display area AA, and the plurality of first connection leads 71 and the plurality of second connection leads 72 are insulated in pairs.

Forming a first signal via 50 in S140 further includes: forming a first signal sub-hole in each of the insulating sub-layers, and forming the first signal via 50 by the first signal sub-holes in the at least two insulating sub-layers. Correspondingly, forming a binding lead 5 in each of the first signal vias 50 in S200 further includes: forming a binding sub-lead in each of the first signal sub-holes of the first signal via 50. Every two adjacent binding sub-leads are coupled by one of the first connection leads 71 in a corresponding lead sub-layer.

Similarly, forming a second signal via 60 in S140 further includes: forming a second signal sub-hole in each of the insulating sub-layers, and forming the second signal via 60 by the second signal sub-holes in the at least two insulating sub-layers. Correspondingly, forming an electrode lead 6 in each of the second signal vias 60 in S200, further includes: forming an electrode sub-lead in each of the second signal sub-holes of the second signal via 60. Every two adjacent electrode sub-leads are coupled by one of the second connection leads 72 in a corresponding lead sub-layer.

It will be appreciated that a different number of lead sub-layers are designed in the display substrate, which corresponds to the different fabrication methods required.

Figure 8:
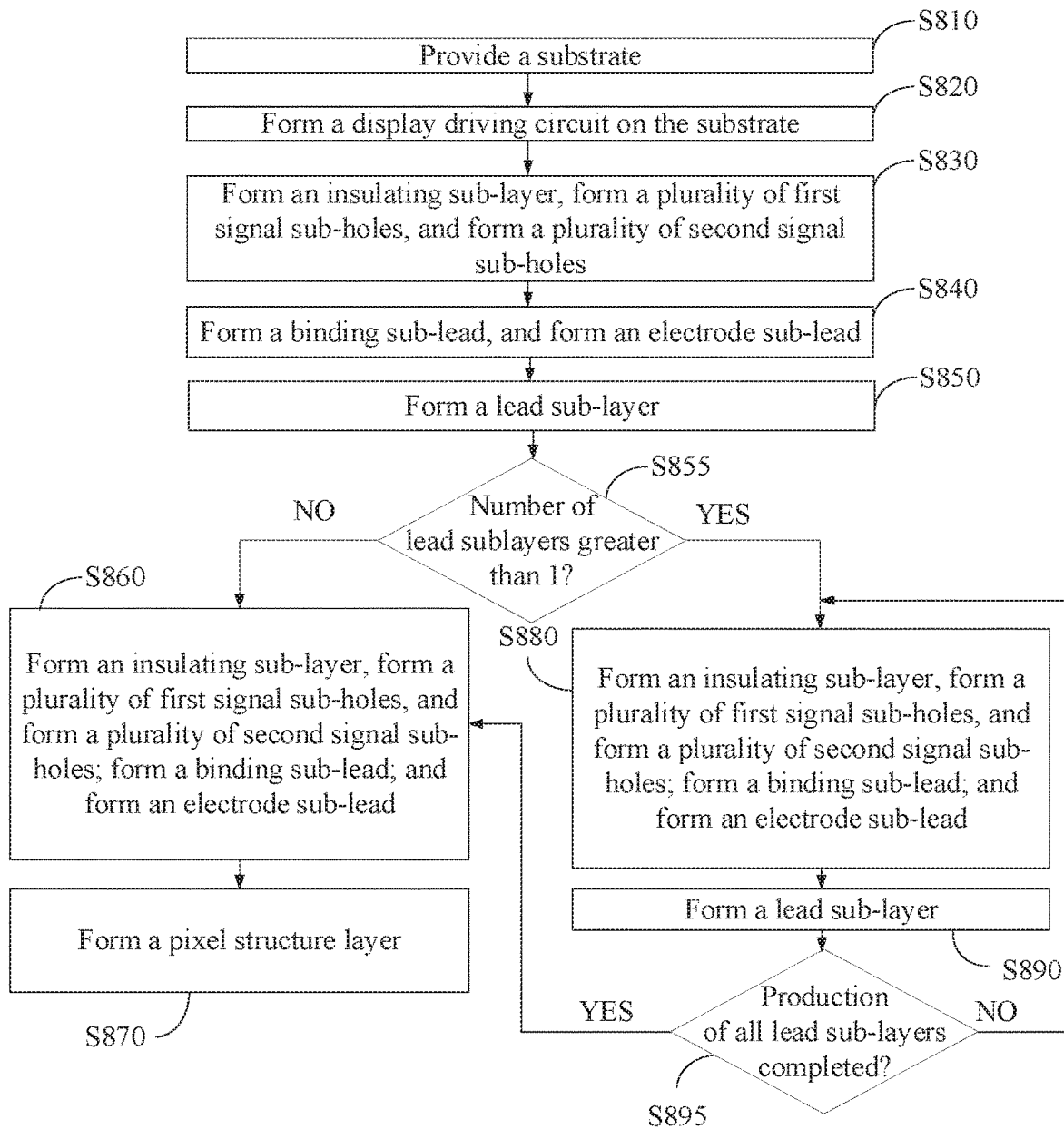
FIG. 8 is a flow block diagram of a method for manufacturing a display substrate according to some arrangements of the present disclosure.

In some examples, referring to FIG. 3 and FIG. 8, the number of the lead sub-layers in the substrate is one (S855: NO), and the method for manufacturing the OLED display substrate is as follows.

A substrate 1 is provided (S810). A display driving circuit 2 is formed on the substrate 1 (S820). An insulating sub-layer, that is, a first insulating sub-layer 31, is formed on the surface of the display driving circuit 2 facing away from the substrate 1 (S830). A plurality of first signal sub-holes are formed in a portion of the first insulating sub-layer 31 located in the at least one binding area, and a plurality of second signal sub-holes are formed in a portion of the first insulating sub-layer 31 located within the display area AA (S830). A first binding sub-lead 51 is formed in each of the first signal sub-holes in the first insulating sub-layer 31, and each of the first binding sub-leads 51 is coupled to an input end of the display driving circuit 2 (S840). A first electrode sub-lead 61 is formed in each of the second signal sub-holes of the first insulating sub-layer 31, and each of the first electrode sub-leads 61 is coupled to an output end of the display driving circuit 2 (S840).

A lead sub-layer is formed on a surface of the first insulating sub-layer 31 facing away from the substrate 1. The lead sub-layer includes a plurality of first connection leads 71 located in the at least one binding area, and a plurality of second connection leads 72 located in the display area AA, and the plurality of first connection leads 71 and the plurality of second connection leads 72 are insulated in pairs (S850). Each of the first connection leads 71 is coupled to a first binding sub-lead 51, and each of the second connection leads 72 is coupled to a first electrode sub-lead 61.

An insulating sub-layer, that is, a second insulating sub-layer 32, is further formed on the surface of the lead sub-layer facing away from the substrate 1 (S860). A plurality of first signal sub-holes are formed in a portion of the second insulating sub-layer 32 covering the plurality of first connection leads 71, and a plurality of second signal sub-holes are formed in a portion of the second insulating sub-layer 32 covering the plurality of second connection leads 72 (S860). A second binding sub-lead 52 is formed in each of the first signal sub-holes in the second insulating sub-layer 32, and each of the second binding sub-leads 52 is coupled to a first connection lead 71 (S860). A second electrode sub-lead 62 is formed in each of the second signal sub-holes of the second insulating sub-layer 32, and each of the second electrode sub-leads 62 is coupled to a second connection lead 72 (S860).

A pixel structure layer 4 is formed on a surface of the second insulating sub-layer 32 facing away from the substrate 1, and each of the light-emitting devices 42 in the pixel structure layer 4 is coupled to a second electrode sub-lead 62 in the second insulating sub-layer 32 (S870).

In the display substrate produced by the above method, the insulating layer 3 is composed of the first insulating sub-layer 31 and the second insulating sub-layer 32. Each of the binding wires 5 is constituted by electrically connecting a first binding sub-lead 51 located in the first insulating sub-layer 31 and a second binding sub-lead 52 located in the second insulating sub-layer 32. Each of the electrode leads 6 is constituted by electrically connecting a first electrode sub-lead 61 located in the first insulating sub-layer 31 and a second electrode sub-lead 62 located in the second insulating sub-layer 32.

In other examples, please continuing to refer to FIG. 6 and FIG. 8, the number of the lead sub-layers in the display substrate is greater than 1 (S855:YES), for example, 3, and the method for manufacturing the display substrate is as follows.

Figure 7A:
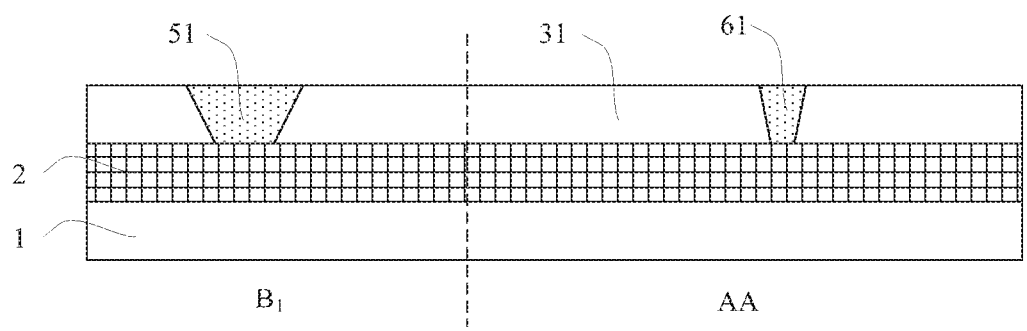
FIG. 7A-7G are schematic structural views showing steps of a method for manufacturing a display substrate shown in FIG. 6.

As shown in FIG. 7A, a substrate 1 is provided (S810). A display driving circuit 2 is formed on the substrate 1 (S820). An insulating sub-layer, that is, a first insulating sub-layer 31, is formed on the surface of the display driving circuit 2 facing away from the substrate 1 (S830). A plurality of first signal sub-holes are formed in a portion of the first insulating sub-layer 31 located in the at least one binding area, and a plurality of second signal sub-holes are formed in a portion of the first insulating sub-layer 31 located within the display area AA (S830). A first binding sub-lead 51 is formed in each of the first signal sub-holes in the first insulating sub-layer 31, and each of the first binding sub-leads 51 is coupled to an input end of the display driving circuit 2 (S840). A first electrode sub-lead 61 is formed in each of the second signal sub-holes of the first insulating sub-layer 31, and each of the first electrode sub-leads 61 is coupled to an output end of the display driving circuit 2 (S840).

Figure 7B:
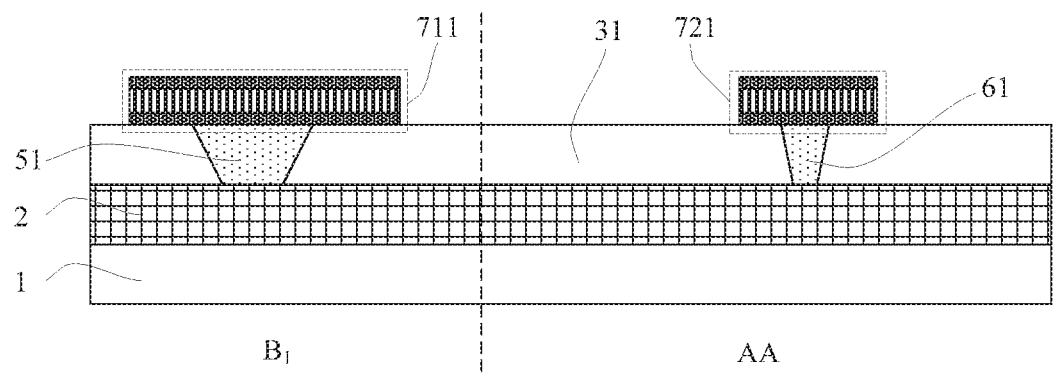

As shown in FIG. 7B, a lead sub-layer (that is, a first lead sub-layer) is formed on a surface of the first insulating sub-layer 31 facing away from the substrate 1. The first lead sub-layer includes a plurality of first connection leads 711 located in the at least one binding area, and a plurality of second connection leads 721 located in the display area AA (S850), and the plurality of first connection leads 711 and the plurality of second connection leads 721 in the first lead sub-layer are insulated in pairs. Each of the first connection leads 711 is coupled to a first binding sub-lead 51, and each of the second connection leads 721 is coupled to a first electrode sub-lead 61.

Figure 7C:
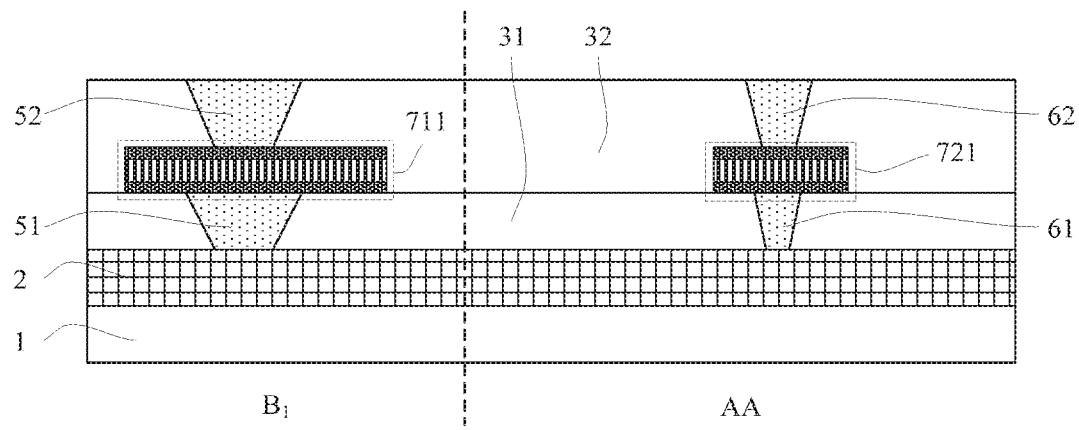

As shown in FIG. 7C, an insulating sub-layer, that is, a second insulating sub-layer 32, is further formed on the surface of the first lead sub-layer facing away from the substrate 1 (S880). A plurality of first signal sub-holes are formed in a portion of the second insulating sub-layer 32 covering the plurality of first connection leads 711, and a plurality of second signal sub-holes are formed in a portion of the second insulating sub-layer 32 covering the plurality of second connection leads 721 (S880). A second binding sub-lead 52 is formed in each of the first signal sub-holes in the second insulating sub-layer 32, and each of the second binding sub-leads 52 is coupled to a first connection lead 711 (S880). A second electrode sub-lead 62 is formed in each of the second signal sub-holes of the second insulating sub-layer 32, and each of the second electrode sub-leads 62 is coupled to a second connection lead 721 (S880).

Figure 7D:
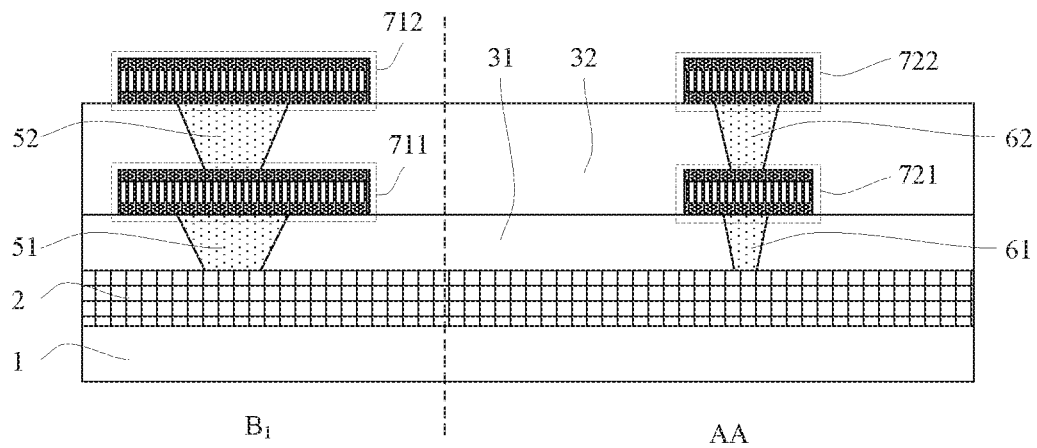

As shown in FIG. 7D, a lead sub-layer (that is, a second lead sub-layer) is formed on a surface of the first insulating sub-layer 31 facing away from the substrate 1 (S890). The second lead sub-layer includes a plurality of first connection leads 712 located in the at least one binding area, and a plurality of second connection leads 722 located in the display area AA, and the plurality of first connection leads 712 and the plurality of second connection leads 721 in the second lead sub-layer are insulated in pairs. Each of the first connection leads 712 is coupled to a second binding sub-lead 52, and each of the second connection leads 722 is coupled to a second electrode sub-lead 62.

Figure 7E:
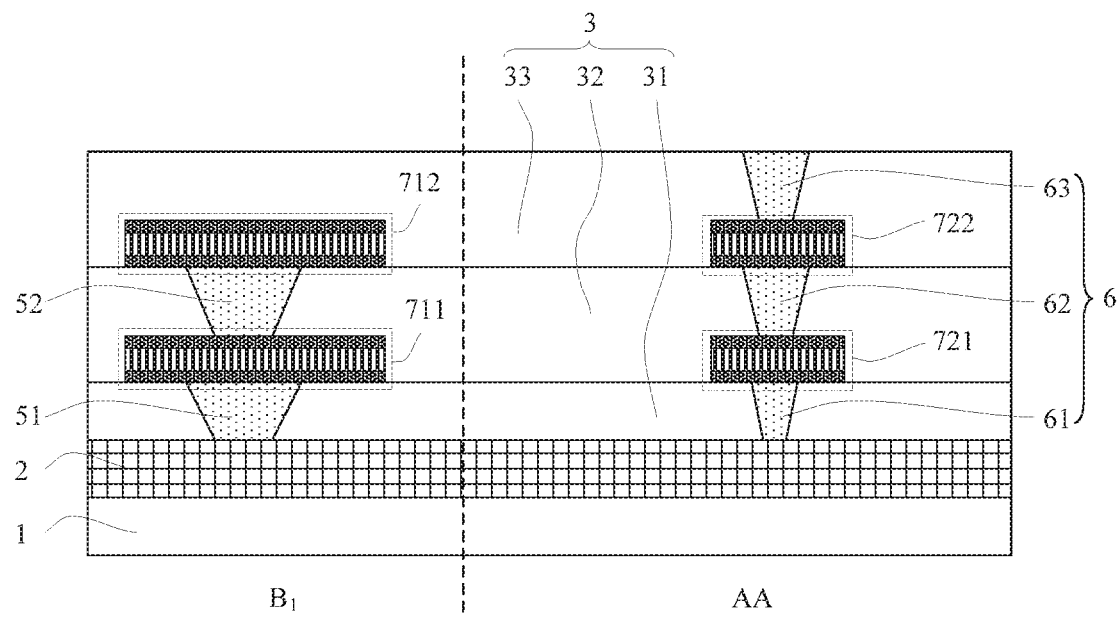

Whereas the production of all lead sub-layers is completed (S895:YES), as shown in FIG. 7E, an insulating sub-layer, that is, a third insulating sub-layer 33, is further formed on the surface of the second lead sub-layer facing away from the substrate 1 (S860). A plurality of second signal sub-holes are formed in a portion of the third insulating sub-layer 33 covering the plurality of second connection leads 722 in the second lead sub-layer, and a third electrode sub-lead 63 is formed in each of the second signal sub-holes of the third insulating sub-layer 33, and each of the third electrode sub-leads 63 is coupled to a second connection lead 722 of the second lead sub-layer (S860).

Figure 7F:
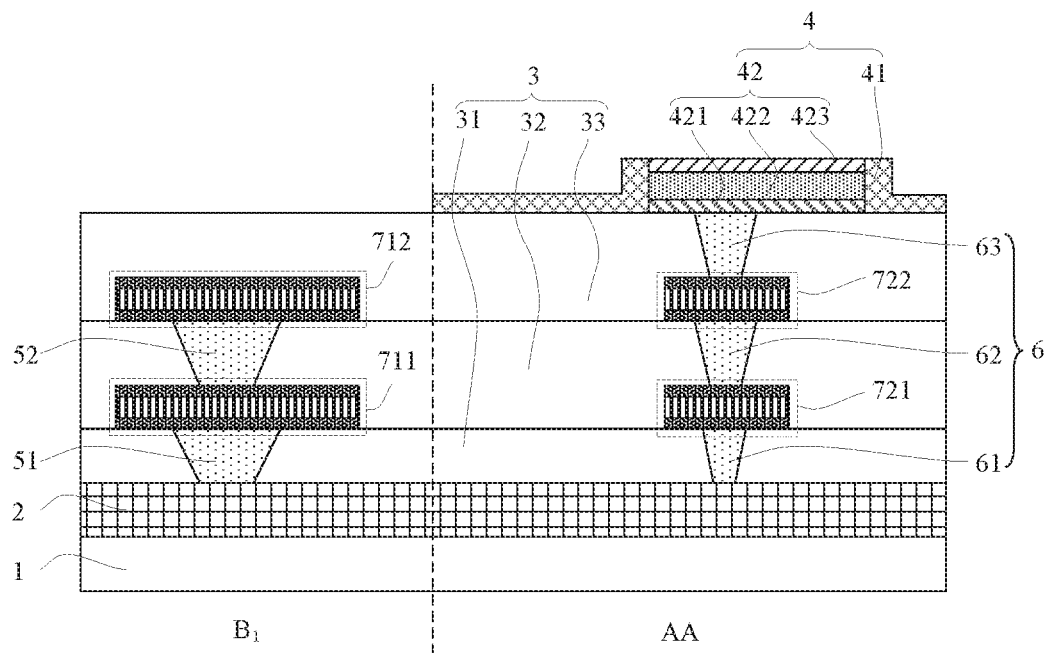

As shown in FIG. 7F, a pixel structure layer 4 is formed on the surface of the third insulating sub-layer 33 facing away from the substrate 1 (S870), and each of the light-emitting devices 42 in the pixel structure layer 4 is coupled to one of the third electrode sub-leads 63 in the third insulating sub-layer 33.

Figure 7G:
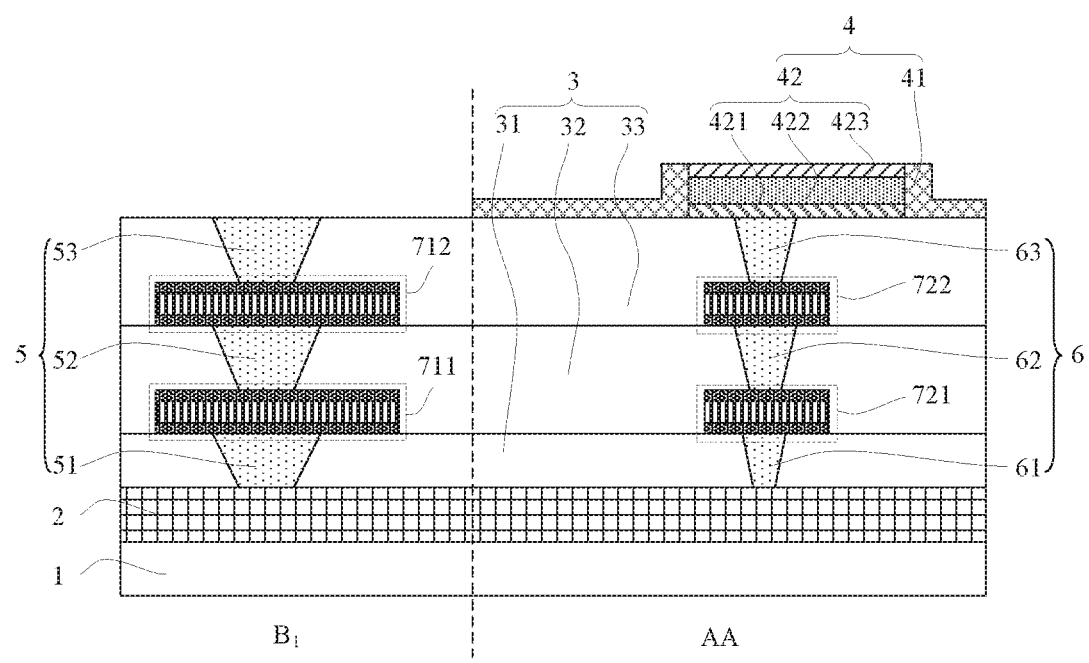

Whereas the production of all lead sub-layers is not completed (S895:NO), as shown in FIG. 7G, a plurality of first signal sub-holes are formed in portions of the third insulating sub-layer 33 covering the plurality of first connection leads 712 in the second lead sub-layer, and a third binding sub-lead 53 is formed in each of the first signal sub-holes in the third insulating sub-layer 33 (S880), and each of the third binding sub-lead s 53 is coupled to a first connection lead 712 in the second lead sub-layer.

Here, the step of "forming a plurality of first signal sub-holes in the third insulating sub-layer 33" is performed lagging behind the step of "forming a plurality of second signal sub-holes in the third insulating sub-layer 33". For example, the step of "forming a plurality of first signal sub-holes in the third insulating sub-layer 33" is performed after the fabrication of the pixel structure layer 4 is completed, which can be avoided that the subsequent fabrication of the pixel structure layer 4 causes contamination for each of the first signal sub-holes or the binding sub-leads formed in each of the first signal sub-holes, which is advantageous for simplifying the manufacturing process of the display substrate and improving the production yield of display substrates.

In an arrangement, it is also possible to perform the step of "forming a plurality of first signal sub-holes in the third insulating sub-layer 33" simultaneously with the step of "forming a plurality of second signal sub-holes in the third insulating sub-layer 33", for example, in the structure as shown in FIG. 7E. Some arrangements of the present disclosure do not limit this.

In addition, if the number of the lead sub-layers in the display substrate is greater than 3, the production steps refers to the corresponding steps shown in FIGS. 7B to 7D in conjunction with FIG. 8, which will not be described in detail herein.

It should be noted that, in some arrangements, after the binding sub-leads are formed in each of the first signal sub-holes, it is necessary to perform chemical mechanical polishing on the exposed surface of each binding sub-lead, so that the exposed surface of each binding sub-lead is relatively flat, which facilitates subsequent fabrication of the display substrate. Similarly, after the electrode sub-leads are formed in each of the second signal sub-holes, it is necessary to perform chemical mechanical polishing on the exposed surface of each electrode sub-lead, so that the exposed surface of each electrode sub-lead is relatively flat, which facilitates subsequent fabrication of the display substrate. In addition, at least one of each of the binding sub-leads or each of the electrode sub-leads is formed by a metal wire binding process.

Some arrangements of the present disclosure also provide a display device including the display substrate provided by some of the above arrangements. The beneficial effects that can be achieved by the display device provided by the arrangements of the present disclosure are the same as those of the display substrate provided by the above arrangements, and are not described herein.

In some examples, the display device is an immersive near-eye display product based on VR or AR technology, including products or components with display functions such as cell phones, tablets, televisions, monitors, laptops, digital photo frames, navigators, smart glasses or smart helmets.

In the description of the above arrangements, specific features, structures, materials or characteristics may be combined in any suitable manner in any one or more arrangements or examples.

The above is only the specific arrangement of the present disclosure, but the scope of the present disclosure is not limited thereto, and any person skilled in the art can easily think of changes or substitutions within the scope of the present disclosure, and should be covered by the scope of the present disclosure. Therefore, the protection scope of the present disclosure should be determined by the scope of the appended claims.

What is claimed is:

1. A display substrate, having a display area and at least one binding area located at a periphery of the display area, the display substrate comprising:
   a plurality of first signal vias disposed in the at least one binding area and configured to provide a binding lead channel; and
   a plurality of second signal vias disposed in the display area and configured to provide an electrode lead channel;
   wherein, each of the first signal vias has an aperture greater than an aperture of any of the second signal vias,
   wherein, the display substrate further comprises a substrate, and a display driving circuit, an insulating layer, and a pixel structure layer stacked on the substrate, wherein the pixel structure layer comprises a plurality of light emitting devices located in the display area, and the plurality of first signal vias and the plurality of second signal vias are disposed in the insulating layer;
   wherein, the display substrate further comprises:
   a binding lead disposed in each of the first signal vias and configured to be bound to an input end of the display driving circuit; and
   an electrode lead disposed in each of the second signal vias and configured to connect an output end of the display driving circuit and one of the light emitting devices; and
   wherein the binding lead has a wire diameter larger than a wire diameter of the electrode lead.

2. The display substrate according to claim 1, wherein the insulating layer comprises at least two insulating sub-layers disposed sequentially along a direction away from the substrate;
   the display substrate further comprises a plurality of lead sub-layers disposed between two adjacent ones of the at least two insulating sub-layers, wherein each of the lead sub-layers comprises a plurality of first connection leads disposed in the at least one binding area, and a plurality of second connection leads disposed in the display area, and the plurality of first connection leads and the plurality of second connection leads are insulated in pairs;
   each of the first signal vias comprises a first signal sub-hole disposed in each of the insulating sub-layers; the binding lead comprises a first binding sub-lead disposed in each of the first signal sub-holes, and every two adjacent first binding sub-leads are electrically coupled through the first connection lead in a corresponding one of the lead sub-layers;
   each of the second signal vias comprises a second signal sub-hole disposed in each of the insulating sub-layers; the electrode lead comprises a first electrode sub-lead disposed in each of the second signal sub-holes, and every two adjacent first electrode sub-leads are electrically coupled through the second connection lead in a corresponding one of the lead sub-layers.

3. The display substrate according to claim 2, wherein
   a second binding sub-lead, in the binding lead, that is closest to the display driving circuit is coupled to an input end of the display driving circuit; and
   a second electrode sub-lead, in the electrode lead, that is closest to the display driving circuit is coupled to an output end of the display driving circuit, and a third electrode sub-lead, in the electrode lead, that is closest to the pixel structure layer is coupled to one of the light emitting devices.

4. The display substrate according to claim 2, wherein
   orthographic projections of at least two of the first signal sub-holes in each of the first signal vias on the substrate at least partially coincide; and
   orthographic projections of at least two of the second signal sub-holes in each of the second signal vias on the substrate at least partially coincide.

5. The display substrate according to claim 2, wherein
   each of the first connection leads and each of the second connection leads in at least one of the lead sub-layers comprises: a first waterproof lead portion, an intermediate conductive lead portion, and a second waterproof lead portion stacked sequentially along a direction away from the substrate.

6. The display substrate of claim 2, wherein each of the first connection leads and each of the second connection leads in at least one of the lead sub-layers are opaque conductive leads.

7. The display substrate according to claim 1, wherein the pixel structure layer further comprises a pixel defining layer disposed on a surface of the insulating layer facing away from the display driving circuit, the pixel defining layer having a plurality of pixel openings, and each of the pixel openings being provided with one of the light emitting devices.

8. The display substrate according to claim 1, wherein each of the light emitting devices comprises an anode and a cathode disposed oppositely, and a light emitting functional layer located between the anode and the cathode, the anode being located on a side of the light emitting functional layer close to the insulating layer.

9. The display substrate according to 8, wherein the anode comprises at least one of a titanium layer, a copper aluminum alloy layer, or a titanium nitride layer.

10. The display substrate according to 8, wherein the anode comprises a titanium layer, a copper aluminum alloy layer, and a titanium nitride layer disposed in a stacked manner.

11. The display substrate according to claim 1, wherein the substrate is a single crystal silicon wafer, and a single crystal silicon material contained in the single crystal silicon wafer has a carrier mobility of 500 cm$^2$/V·s~1500 cm$^2$/V·s.

12. A method for manufacturing a display substrate, comprising:

forming a plurality of first signal vias configured to provide a binding lead channel in at least one binding area of the display substrate, and forming a plurality of second signal vias configured to provide an electrode lead channel in a display area of the display substrate, wherein each of the first signal vias has an aperture greater than an aperture of any of the second signal vias; and forming a binding lead in each of the first signal vias, and forming an electrode lead in each of the second signal vias, wherein each of the binding leads has a wire diameter greater than a wire diameter of any of the electrode leads, wherein forming a plurality of first signal vias configured to provide a binding lead channel in at least one binding area of the display substrate, and forming a plurality of second signal vias configured to provide an electrode lead channel in a display area of the display substrate, comprises:

providing a substrate;

forming a display driving circuit on the substrate, the display driving circuit comprising a plurality of input ends located in the at least one binding area, and a plurality of output ends located in the display area;

forming an insulating layer on a surface of the display driving circuit away from the substrate;

forming the plurality of first signal vias in a portion of the insulating layer covering the plurality of input ends, and at least one of the first signal vias corresponding to one of the input ends; and forming the plurality of second signal vias in a portion of the insulating layer covering the plurality of output ends, and at least one of the second signal vias corresponding to one of the output ends.

13. The method for manufacturing a display substrate according to claim 12, wherein forming an insulating layer on a surface of the display driving circuit away from the substrate, further comprises: forming at least two insulating sub-layers sequentially on the surface of the display driving circuit away from the substrate;

the method for manufacturing the display substrate further comprises: forming, during a process for forming every two adjacent insulating sub-layers, a lead sub-layer on an insulating sub-layer formed firstly in the every two adjacent insulating sub-layers, wherein the lead sub-layer comprises a plurality of first connection leads disposed in the at least one binding area, and a plurality of second connection leads disposed in the display area, and the plurality of first connection leads and the plurality of second connection leads are insulated in pairs;

forming a first signal via further comprises: forming a first signal sub-hole in each of the insulating sub-layers, and forming the first signal via by the first signal sub-holes in the at least two insulating sub-layers;

forming a binding lead in each of the first signal vias further comprises: forming a binding sub-lead in each of the first signal sub-holes of the first signal via, wherein every two adjacent binding sub-leads are coupled by one of the first connection leads in a corresponding lead sub-layer;

forming a second signal via further comprises: forming a second signal sub-hole in each of the insulating sub-layers, and forming the second signal via by the second signal sub-holes in the at least two insulating sub-layers; and forming an electrode lead in each of the second signal vias further comprises: forming an electrode sub-lead in each of the second signal sub-holes of the second signal via, wherein every two adjacent electrode sub-leads are coupled by one of the second connection leads in a corresponding lead sub-layer.

14. The method of manufacturing the display substrate according to claim 12, further comprising:

forming a pixel structure layer on a surface of the insulating layer away from the display driving circuit, wherein the pixel structure layer comprises a plurality of light emitting devices located in the display area, and one of the light emitting devices is coupled to at least one electrode lead.

15. The method for manufacturing a display substrate according to claim 14, wherein each of the light emitting devices comprises an anode and a cathode disposed oppositely, and a light emitting functional layer located between the anode and the cathode;

forming a pixel structure layer on a surface of the insulating layer away from the display driving circuit comprises:

forming a plurality of anodes patterned on the surface of the insulating facing away from the display driving circuit by using a dry etching process, the plurality of anodes being located in the display area and each anode being coupled to at least one electrode lead;

forming a pixel defining layer having a plurality of pixel openings on a surface of the insulating layer not covered by the plurality of anodes, wherein an orthographic projection of each pixel opening on the substrate is located within an orthographic projection of one anode on the substrate;

forming the light emitting functional layer in contact with the anode in each of the pixel openings; and forming the cathode on a surface of each of the light emitting functional layer away from the anode.

16. A display device, comprising a display substrate having a display area and at least one binding area located at a periphery of the display area, wherein the display substrate comprises:

a plurality of first signal vias disposed in the at least one binding area and configured to provide a binding lead channel; and a plurality of second signal vias disposed in the display area and configured to provide an electrode lead channel;

wherein, each of the first signal vias has an aperture greater than an aperture of any of the second signal vias, wherein the display substrate further comprises a substrate, and a display driving circuit, an insulating layer, and a pixel structure layer stacked on the substrate, wherein the pixel structure layer comprises a plurality of light emitting devices located in the display area, and the plurality of first signal vias and the plurality of second signal vias are disposed in the insulating layer;

the display substrate further comprises:
a binding lead disposed in each of the first signal vias and configured to be bound to an input end of the display driving circuit; and
an electrode lead disposed in each of the second signal vias and configured to connect an output end of the display driving circuit and a light emitting device;
wherein each of the binding leads has a wire diameter greater than a wire diameter of any of the electrode leads.

17. The display device according to claim 16, wherein the insulating layer comprises at least two insulating sub-layers disposed sequentially along a direction away from the substrate;
the display substrate further comprises a lead sub-layer disposed between every two adjacent insulating sub-layers, wherein each of the lead sub-layer comprises a plurality of first connection leads disposed in the at least one binding area, and a plurality of second connection leads disposed in the display area, and the plurality of first connection leads and the plurality of second connection leads are insulated in pairs;
each of the first signal vias comprises a first signal sub-hole disposed in each of the insulating sub-layers; each of the binding leads comprises a binding sub-lead disposed in each of the first signal sub-holes, and every two adjacent binding sub-leads are electrically coupled through the first connection lead in a corresponding lead sub-layer;
each of the second signal vias comprises a second signal sub-hole disposed in each of the insulating sub-layers; each of the electrode leads comprises an electrode sub-lead disposed in each of the second signal sub-holes, and every two adjacent electrode sub-leads are electrically coupled through the second connection lead in a corresponding lead sub-layer.

* * * * *